(12) United States Patent
Kruger et al.

(10) Patent No.: US 7,666,290 B2
(45) Date of Patent: Feb. 23, 2010

(54) METHOD AND DEVICE FOR PRODUCING A TEXTURED METAL STRIP

(75) Inventors: Ursus Kruger, Berlin (DE); Marc de Vogelaere, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 1123 days.

(21) Appl. No.: 10/484,770

(22) PCT Filed: Jul. 23, 2002

(86) PCT No.: PCT/DE02/02751

§ 371 (c)(1),
(2), (4) Date: Jan. 23, 2004

(87) PCT Pub. No.: WO03/012172

PCT Pub. Date: Feb. 13, 2003

(65) Prior Publication Data

US 2004/0206630 A1    Oct. 21, 2004

(30) Foreign Application Priority Data

Jul. 25, 2001    (DE) ................................ 101 36 890

(51) Int. Cl.
*C25D 1/04*   (2006.01)
*B05D 5/12*   (2006.01)
(52) U.S. Cl. ............................. 205/76; 205/77; 427/62
(58) Field of Classification Search .................. 428/98, 428/96; 205/76, 77, 183, 206, 138; 427/62
See application file for complete search history.

(56) References Cited

U.S. PATENT DOCUMENTS

| | | | | |
|---|---|---|---|---|
| 4,108,737 A | * | 8/1978 | Ehrhardt et al. ............... | 205/51 |
| 4,530,739 A | * | 7/1985 | Hanak et al. ................... | 427/74 |
| 5,741,377 A | * | 4/1998 | Goyal et al. ................ | 148/512 |
| 5,968,877 A | * | 10/1999 | Budai et al. ................. | 505/237 |
| 6,180,570 B1 | * | 1/2001 | Goyal .......................... | 505/236 |
| 6,346,181 B1 | * | 2/2002 | Lee et al. ....................... | 205/89 |
| 6,730,410 B1 | * | 5/2004 | Fritzemeier et al. ......... | 428/469 |

FOREIGN PATENT DOCUMENTS

| | | |
|---|---|---|
| DE | 199 42 849 | 3/2001 |
| GB | 1537243 | 12/1978 |
| JP | 54037039 | 3/1979 |
| JP | 56139689 | 10/1981 |
| JP | 62287091 | 12/1987 |
| JP | 3264684 | 11/1991 |
| JP | 8236120 | 9/1996 |
| JP | 2000328284 | 11/2000 |
| JP | 2001030266 | 2/2001 |
| JP | 2002270186 | 9/2002 |
| WO | WO 03012166 | 2/2003 |

OTHER PUBLICATIONS

Goodall et al., "Fabrication of Cubed-Textured Ag-Buffered Ni Substrates by Electro-Epitaxial Deposition", Supercond. Sci. Technol., vol. 14 (no month, 2001), pp. 124-129.*

(Continued)

*Primary Examiner*—Edna Wong
(74) *Attorney, Agent, or Firm*—Young & Thompson

(57) ABSTRACT

The invention relates to a method for producing a textured metal strip. In order to be able to implement a method of this type in a comparatively simple manner and thus cost-effectively, a metal layer (4) is galvanically produced on a textured substrate (1) having electrical conductivity, and the metal layer (4), while producing the textured strip (4a), is removed from the substrate (1).

20 Claims, 2 Drawing Sheets

OTHER PUBLICATIONS

Figure 1:
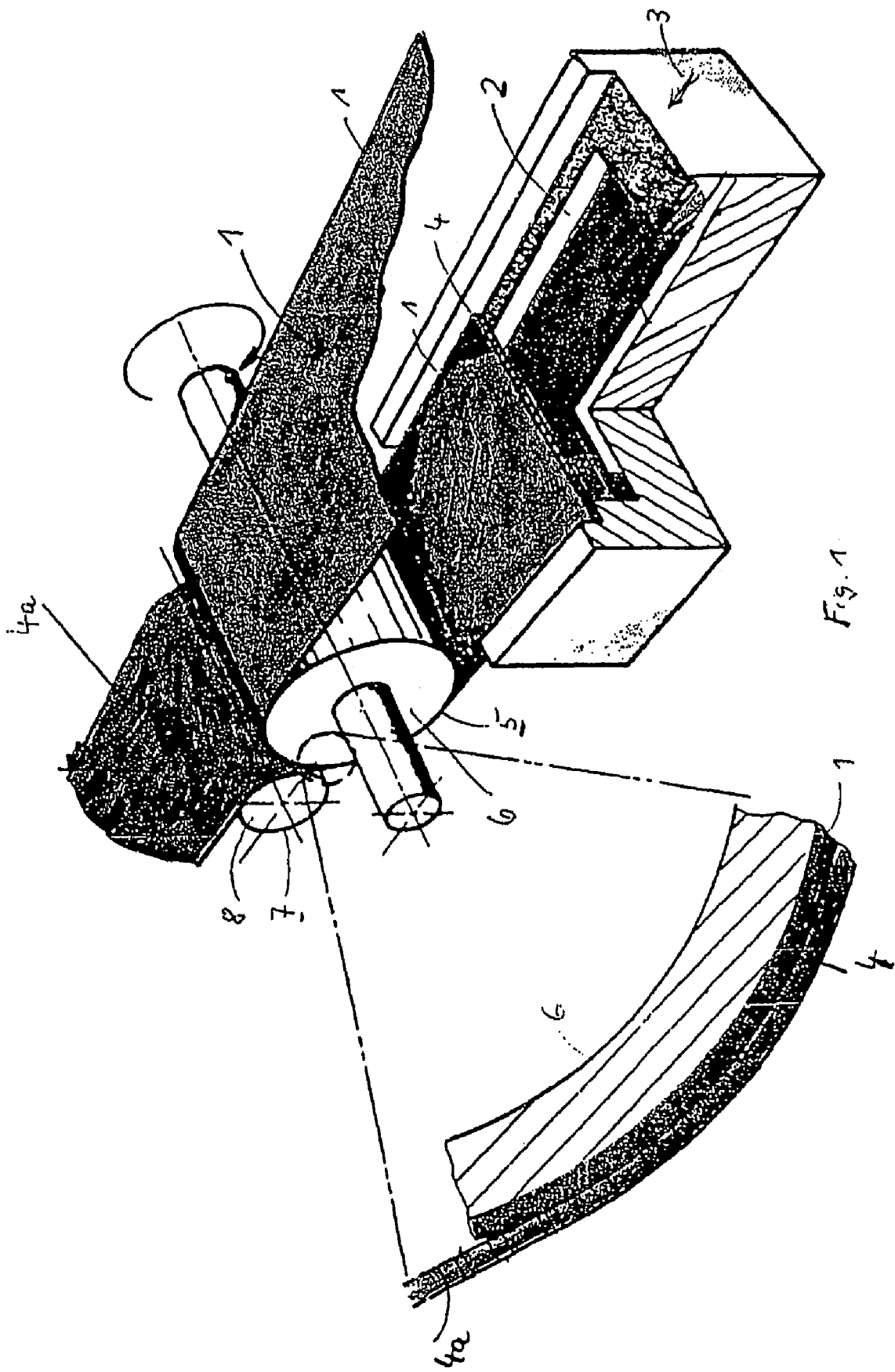

Bellingeri et al., "Electrodeposition of Biaxially Aligned Ti-based Superconducting on Ag Tapes", IEEE Trans. on Appl. Supercond., vol. 11, No. 1 (Mar. 2001), pp. 3122-3125.*

Goldacker et al., "Biaxially Textured Substrate Tapes of Cu, Ni, Alloyed Ni, Ag for YBCO Films", Institute of Physics Conference Series (no month, 1997), vol. 158 (Applied Superconductivity 1997, vol. 2), pp. 1279-1282. Abstract Only (2pp).*

Bellingeri et al., "Electrodeposition of Biaxially Aligned Ti-based Superconductors on Ag Tapes", IEEE Transactions on Applied Superconductivity, vol. 11, No. 11, Mar. 2001, pp. 3122-3125.*

Nishio et al., "Superconducting and Mechanical Properties of YBCO-Ag Composite Superconductors", J. of Mater.Sci., vol. 24 (no month, 1989), pp. 3228-3234.*

Goldacker et al., "Biaxially Textured Substrate Tapes of Cu, Ni, Alloyed Ni, Ag for YBCO Films", Institute of Physics Conference Series (no month, 1997), vol. 158 (Applied Superconductivity 1997, vol. 2), pp. 1279-1282. Full Document.*

HongLi Suo et al., "Preparation and characterization of {100} [001] cube textured Ag substrates for in-plane oriented HTS tapes", Supercond. Sci. Technol., 12, 1999, pp. 624-631.

R. Goodall et al., "Fabrication of cube-textured Ag-buffered Ni substrates by electro-epitaxial deposition", Supercond. Sci. Technol., 14, 2001, pp. 124-129.

Japanese Office Action in corresponding JP 2003517341.

International search report in corresponding PCT/DE 0202751.

* cited by examiner

METHOD AND DEVICE FOR PRODUCING A TEXTURED METAL STRIP

CROSS REFERENCE TO RELATED APPLICATIONS

This is the 35 USC 371 National Stage of International Application PCT/DE02/02751 filed on 23 Jul. 2002, which designated the United States of America

BACKGROUND OF THE INVENTION

The invention relates to a process for producing a textured strip from metal, in which a metal layer is produced by electroplating on a textured substrate with an electrical conductivity.

DESCRIPTION OF THE RELATED ART

A process of this type is described, for example, in the journal "Supercond. Sci. Technol." 14 (2001), pages 124 to 129. In this known process, a metallic, textured strip is provided on one side with a very thin textured layer (170 to 250 nm) by this layer being deposited electrolytically on the strip. This layer can be used, for example, for deposition of a superconductor.

Another process for producing textured strips is known, for example, from the journal "Supercond. Sci. Technol." 12 (1999), pages 624 to 632. In this known process, a strip made from metal is provided with a texture by carrying out rolling procedures using strips made from nickel or silver or from alloys comprising these metals in combination with subsequent annealing steps in order to initiate recrystallization processes. Specialists in the field refer to strips of this type as RABITS (Rolling assisted biaxial texturing of substrates). RABITS of this type form the base material for the production of superconducting conductors.

Furthermore, German laid-open specification DE 199 42 849 A1 has disclosed a process which can be used to produce metallic strips on a substrate in a thickness which is sufficient for it then to be possible for these strips to be separated from the substrate.

BRIEF SUMMARY OF THE INVENTION

The invention is based on the object of providing a process for producing a textured strip which can be carried out at relatively low cost.

To achieve this object, according to the invention, the metal layer is removed from the substrate so as to obtain the textured strip.

The main advantage of the process according to the invention consists in the fact that after a textured substrate with an electrical conductivity has been produced, a textured strip of metal which is eminently suitable for the application of a layer of a superconducting material to form a superconductor can be produced using the "template" obtained in this way by means of in each case a simple electroplating process followed by removal of the metal layer from the template or from the textured substrate.

Substrates which are designed differently with a view to ensuring the electrical conductivity can be used in the process according to the invention. For example, it is considered advantageous if a substrate made from electrically nonconductive material with an electrically conductive surface is used, since in this way it is even possible, for example, to use plastics to produce the substrate.

However, it may also be advantageous to use a substrate made from a metal, since then only a single material has to be employed to obtain the substrate.

The textured substrate may have various geometric dimensions, for example may be in the form of a plate. It is deemed particularly advantageous for a substrate strip to be used as the textured substrate, since this is particularly suitable for the production of a textured strip from metal.

Various textured substrate strips can be used in the process according to the invention. For example, it is considered advantageous if a non-textured metal strip with an applied biaxially textured metal layer is used as the substrate strip.

Furthermore, it may be advantageous if a metal strip which has been textured by rolling procedures followed by annealing steps is used as the substrate strip, i.e. if metal substrates which have been produced using the RABITS process are employed.

The process according to the invention can be used to produce metal layers formed from various metals on the substrate. The application of a metal layer made from nickel or a nickel alloy may be advantageous. However, it appears particularly advantageous for a metal layer made from silver or copper or from a silver alloy or copper alloy to be applied, since no disruptive influences caused by losses resulting from paramagnetism occur during subsequent use in an alternating magnetic field, unlike with nickel.

In the process according to the invention, it is possible for the substrate used to be a stretched strip of defined length which is drawn through an electroplating device in order to form the metal layer and which the metal layer is subsequently pulled off as a textured strip. However, it is considered particularly advantageous for the substrate strip used to be an endless substrate strip which is passed through an electroplating bath so as to form the metal layer and which the metal layer is subsequently pulled off, since in this way it is possible to obtain a textured metal strip of virtually any desired length.

The endless substrate strip may have various uses. It appears advantageous if the endless substrate strip is passed through the electroplating bath over rolls. In another advantageous embodiment of the process according to the invention, the substrate strip is applied to the outside of a roller and the roller is set in rotary motion, with immersion in an electroplating bath.

In another advantageous variant of the process according to the invention, a textured substrate which has nonconductive regions is used. The main advantage of this embodiment is that during the production of the metal layer by electroplating, no metal layer is formed in nonconductive regions, so that—in the case of a layer of a superconducting material which is subsequently to be applied in order to form a superconductor—the topology for the superconductor is already predetermined without further steps being carried out for this purpose.

The invention also relates to an apparatus for producing a strip from metal, in which a drive device for an endless substrate strip is assigned to an electroplating bath in such a manner that the endless substrate strip runs through the electroplating bath so that a metal layer is formed on the endless substrate strip, and an apparatus for pulling the metal layer off the endless substrate strip is located adjacent to the drive device.

The invention is also based on the object of providing an apparatus which allows inexpensive production of a textured strip from metal.

This object is achieved by virtue of the fact that the endless substrate strip has a texture.

The particular advantage of this apparatus is considered to reside in the fact that a textured strip made from metal of virtually any desired length can be produced with little outlay. Various designs of drive device can be used in the apparatus according to the invention. If a stretched drive device is preferred, according to the invention the drive device has at least two rolls, around which the endless substrate strip is guided and by means of which it is driven. A more compact drive apparatus can be achieved if the drive device has a driven roller which bears the endless substrate strip on its outer circumference.

The invention also relates to a textured strip which is a strip which has been produced by electroplating using a textured metal substrate in strip form.

Furthermore, the invention is based on the object of providing a textured strip which is simple and therefore inexpensive to produce.

The solution to this object consists in the strip having been provided with texture-free regions directly during the production by electroplating.

To facilitate the production of a superconducting conductor, the strip produced by electroplating has holes.

The textured strip advantageously consists of nickel or a nickel alloy or of silver or copper of a silver or copper alloy.

The use of a strip of metal, such as for example silver or a silver alloy, which has been produced by electroplating by means of a textured substrate as a support for a layer made from a superconducting material to form a superconducting conductor is also considered part of the invention. A superconducting conductor of this type, in the case of a strip made from silver or copper, does not cause any disruptive influences when used in alternating magnetic fields.

BRIEF DESCRIPTION OF THE DRAWING FIGURES

Figure 2:
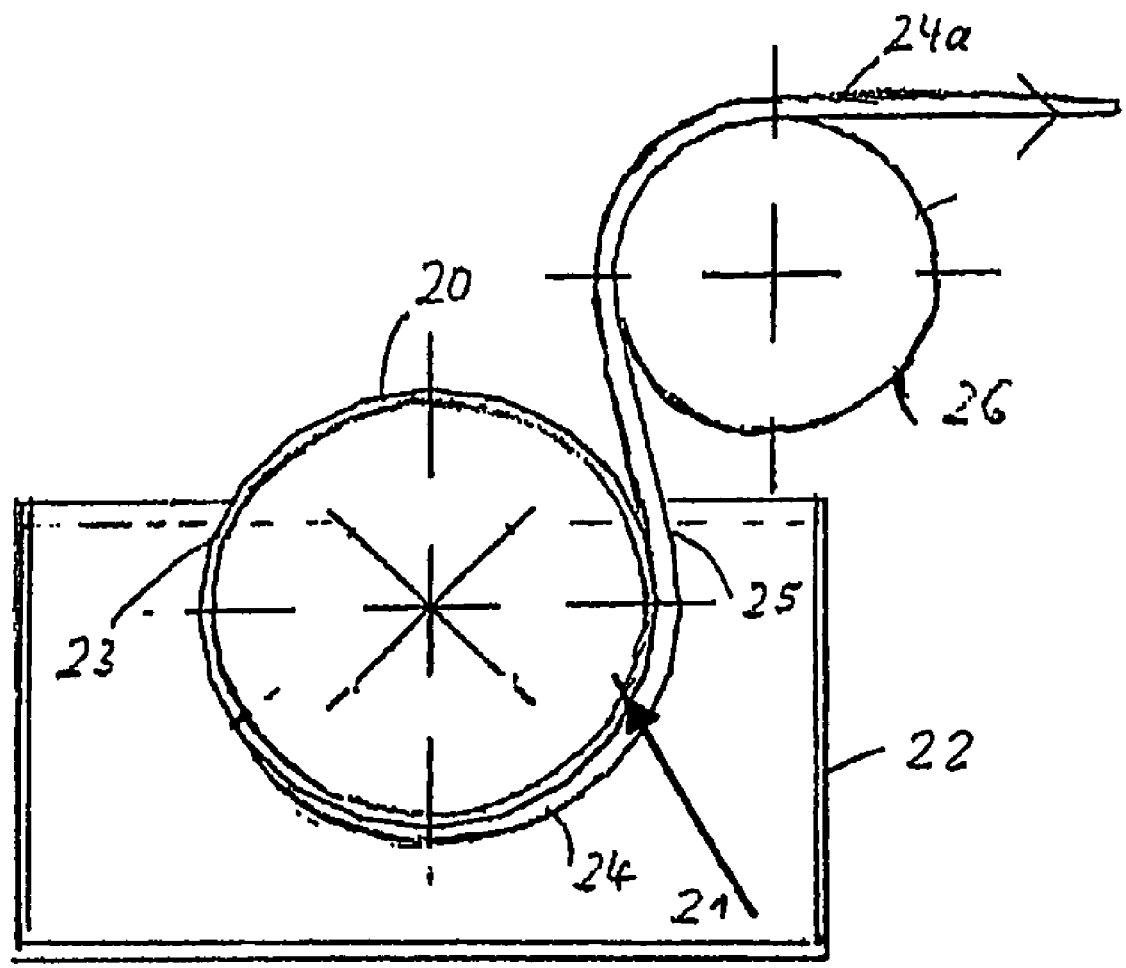

To explain the process according to the invention:

FIG. 1 shows an exemplary embodiment of an apparatus for producing a textured strip from metal, and FIG. 2 shows a further exemplary embodiment of an apparatus of an apparatus of this type.

DETAILED DESCRIPTION OF THE PREFERRED EMBODIMENTS

Carrying out the process according to the invention requires a textured substrate, for example made from metal, which may be produced, for example, using the RABITS process. In this respect, the term "texture" describes a crystallographic orientation of the order of atoms in an atomic structure.

FIG. 1 shows a textured substrate in the form of an endless substrate strip 1, onto which a textured metal layer 4 grows gradually by electroplating as it passes through an electroplating bath 2 in the direction indicated by arrow 3. The endless substrate strip 1 is driven by a drive device 5 with guide rolls, of which only a single guide roll 6 can be seen in FIG. 1.

An apparatus 7 for pulling the metal layer 4 off the textured endless substrate strip 1 is arranged adjacent to the drive device 5; the apparatus 7 has a pull-off roll 8, downstream of which there is a pulling apparatus (not shown in more detail) for the metal layer 4. The metal layer 4 forms a textured strip 4a made from metal which can be designed to be of virtually any desired length using the apparatus illustrated.

The enlarged partial illustration presented in FIG. 1 shows the operation of separating the metal layer 4a or the textured strip 4 from the textured substrate.

This textured strip 4a is then eminently suitable as a support for a layer made from a superconducting material, e.g. $Yba_2Cu_3O_7$, if a superconducting conductor is to be produced.

In the exemplary embodiment shown in FIG. 2, a textured endless substrate strip 20 has been applied to a roller 21. The roller 21 is arranged rotatably in an electroplating bath 22, which is only diagrammatically illustrated. During the rotary movement of the roller 21, a textured metal layer 24 starts to grow in each case from the immersion region 23 of the roller 21 into the electroplating bath 22, reaching its maximum thickness in the region 25 where the roller emerges again, where the metal layer 24, as a textured strip 24a of metal, is pulled off the roller 21 by means of a pull-off roll 26 as a pulling-off device.

The invention claimed is:

1. A process for producing a textured strip from metal, which comprises:
   electroplating a metal layer on a biaxially crystallographically textured substrate with an electrical conductivity;
   removing the metal layer from the biaxially crystallographically textured substrate so as to obtain the textured strip; and
   coating the textured strip with a layer of superconducting material to form a superconducting conductor, supported by the textured strip.

2. The process as claimed in claim 1, wherein the substrate is made from electrically nonconductive material with an electrically conductive surface.

3. The process as claimed in claim 1, wherein the substrate comprises a metal.

4. The process as claimed in claim 1, wherein a textured substrate strip is used as the textured substrate.

5. The process as claimed in claim 4, wherein a non-textured metal strip with applied biaxially textured metal layer is used as the substrate strip.

6. The process as claimed in claim 4, wherein a metal strip which has been textured by rolling procedures followed by annealing steps is used as the substrate strip.

7. The process as claimed in claim 1, wherein the metal layer comprises nickel or a nickel alloy.

8. The process as claimed in claim 1, wherein the metal layer comprises silver or a silver alloy.

9. The process as claimed in claim 1, wherein the substrate is an endless substrate strip which is passed through on electroplating bath so as to form the metal layer and the removing the metal layer is performed by pulling off from the endless substrate strip.

10. The process as claimed in claim 9, wherein the endless substrate strip is passed through the electroplating bath over rolls.

11. The process as claimed in claim 9, wherein the substrate strip is applied to an outside of a roller, and the roller is set in rotary motion, with immersion in the electroplating bath.

12. The process as claimed in claim 1, wherein the textured substrate has texture-free regions.

13. The process as claimed in claim 1, wherein the textured strip is a biaxially crystallographically oriented texture strip.

14. A process for producing a biaxially crystallographically oriented strip from metal, which comprises:
   electroplating a metal layer on a biaxially crystallographically oriented substrate with an electrical conductivity;
   removing the metal layer from the substrate so as to obtain the biaxially crystallographically oriented strip; and
   coating the biaxially crystallographically oriented strip with a layer of superconducting material to form a superconducting conductor, supported by the biaxially crystallographically oriented strip.

15. The process as claimed in claim 14, wherein the substrate is made from electrically nonconductive material with an electrically conductive surface.

16. The process as claimed in claim 14, wherein the substrate comprises a metal.

17. The process as claimed in claim 14, wherein a biaxially crystallograpically oriented substrate strip is used as the biaxially crystallographically oriented substrate.

18. The process as claimed in claim 17, wherein a non-biaxially crystallograpically oriented metal strip with an applied biaxially crystallographically oriented metal layer is used as the substrate strip.

19. The process as claimed in claim 17, wherein a metal strip which has been biaxially crystallograpically oriented by rolling procedures followed by annealing steps is used as the substrate strip.

20. The process as claimed in claim 14, wherein the metal layer comprises nickel or a nickel alloy.

\* \* \* \* \*